(12) United States Patent
Joyner

(10) Patent No.: US 6,171,969 B1
(45) Date of Patent: Jan. 9, 2001

(54) UNIFORM DOPANT DISTRIBUTION FOR MESAS OF SEMICONDUCTORS

(75) Inventor: Keith A. Joyner, Richardson, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/266,520

(22) Filed: Mar. 11, 1999

Related U.S. Application Data

(60) Provisional application No. 60/077,967, filed on Mar. 13, 1998.

(51) Int. Cl.$^7$ ................................................. H01L 21/311
(52) U.S. Cl. ............................................ 438/700; 438/700
(58) Field of Search ........................... 438/343, 39, 41, 438/45, 501, 505, 514, 561, 559, 495, 499, 440, 981, 228, 270

(56) References Cited

U.S. PATENT DOCUMENTS

| | | | |
|---|---|---|---|
| 4,238,763 | * 12/1980 | Gray et al. ........................... | 357/68 |
| 4,743,563 | * 5/1988 | Pfiester et al. ...................... | 437/24 |
| 5,119,148 | * 6/1992 | Anderson et al. ................... | 357/14 |
| 5,126,281 | * 6/1992 | Carey et al. ......................... | 438/559 |
| 5,242,859 | * 9/1993 | Degelormo et al. ................ | 437/165 |
| 5,298,442 | * 3/1994 | Bulucea et al. ..................... | 437/40 |

* cited by examiner

*Primary Examiner*—David Nelms
*Assistant Examiner*—David Nhu
(74) *Attorney, Agent, or Firm*—Jacqueline J. Garner; W. James Brady, III; Frederick J. Telecky, Jr.

(57) ABSTRACT

A semiconductor device and method having mesas with uniformly-doped regions 18. A semiconductor substrate 10 is uniformly-doped and then, mesas 12 are formed in the semiconductor surface. Advantages of the invention include a mesa 12 having a uniformly-doped surface, solving the problem of non-uniformity of doping density caused by lateral ion straggling found in the prior art. Another advantage of the invention is a structure having evenly-doped mesas yet undoped trenches.

4 Claims, 1 Drawing Sheet

UNIFORM DOPANT DISTRIBUTION FOR MESAS OF SEMICONDUCTORS

This application claims priority under 35 USC §119 (e)(1) of provisional application no. 60/077,967, filed Mar. 13, 1998.

FIELD OF THE INVENTION

This invention relates generally to the manufacture of integrated circuits, and more specifically, to the implantation of dopants into mesas and other elevated structures on semiconductor wafers.

BACKGROUND OF THE INVENTION

Semiconductors are widely used in integrated circuits for electronic applications, including radios, computers and televisions. Such integrated circuits typically use multiple transistors fabricated in single crystal silicon. A feature of semiconductors that make them so useful for electronic devices is that their conduction properties may be changed by introducing small quantities of dopant atoms.

Ion implantation is a method of introducing dopants into semiconductor surfaces. Ion implantation introduces impurities into a semiconductor wafer by accelerating ions to a high velocity and directing them towards the wafer surface. The dopant atoms enter the crystal lattice of the wafer, collide with surface substrate atoms and gradually lose energy, finally coming to rest at some depth within the lattice. During ion implantation, ions travel in a relatively straight path initially, then travel in a zigzag path during which nuclear collisions absorb energy until they stop moving and settle into the solid at a particular range. Each ion is subject to a slightly different set of conditions and thus has a different range.

When devices such as, for example, transistors, thyristors, diodes, etc., are formed in a semiconductor surface, active areas or mesas are created. These mesas may be doped in a subsequent step by ion implantation.

SUMMARY OF THE INVENTION

A problem in the prior art is non-uniformity of ion implantation on mesas in a semiconductor surface that results from implanting ions after the mesas have been formed. Lateral ion straggling causes a non-uniformity of dopant concentration because fewer ions are implanted at the edge of the mesas. Lateral ion straggling results in ions leaving the edge of the mesa and thus exiting the elevated semiconductor surface, with fewer ions being implanted at the edge of the mesas. A uniform, controllable, and reproducible method of introducing a dopant to the surface of a mesa is needed in the art. Another problem in the prior art is that recessed areas are also doped during the ion implantation process, which may not be desired.

These problems of the prior art are overcome by the present invention. The present invention is a method for manufacturing a uniformly-doped mesa on a semiconductor surface, including the steps of providing a semiconductor wafer, doping the surface of the semiconductor wafer and forming mesas in the semiconductor surface.

The present invention of doping the semiconductor surface before forming the mesas offers definite advantages over conventional processes. A mesa structure is provided that contains improved uniform dopant distribution, and where the trenches of the semiconductor wafer are not doped, eliminating the problems of the prior art.

DETAILED DESCRIPTION OF THE PREFERRED EMBODIMENTS

The making and use of the presently preferred embodiments are discussed below in detail. However, it should be appreciated that the present invention provides many applicable inventive concepts which may be embodied in a wide variety of specific contexts. The specific embodiments discussed are merely illustrative of specific ways to make and use the invention and do not delimit the scope of the invention. The following is a description of several embodiments of the present invention, including manufacturing methods.

Corresponding numerals and symbols in the different figures refer to corresponding parts unless otherwise indicated. Table 1 below provides an overview of the elements in the embodiments and the drawings.

TABLE 1

| ELE-MENT | GENERIC TERM | PREFERRED OR SPECIFIC EXAMPLES | OTHER ALTERNATE EXAMPLES OR DESCRIPTIONS |
|---|---|---|---|
| 10 | Wafer Substrate | Silicon | May include other metal layers or semi-conductor elements e.g. GaAs, InP, Si/Ge, SiC |
| 12 | Mesa | Primary square or rectangular shaped structure formed in substrate 10 | Active areas. |
| 14 | Center region of mesa 12 | | |
| 16 | Edge region of mesa 12 | | |
| 18 | Uniformly-doped regions of mesa 12 | | |
| 20 | Trenches | Rectangular, square or trape-zoidal-shaped recesses formed in substrate 10 | Recesses |

Figure 1:
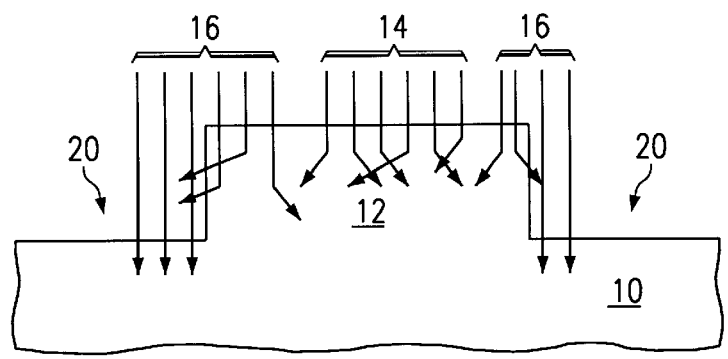
FIGS. 1 and 2 illustrate in cross section process steps in accordance with a prior art device and method of manufacturing.
Figure 2:
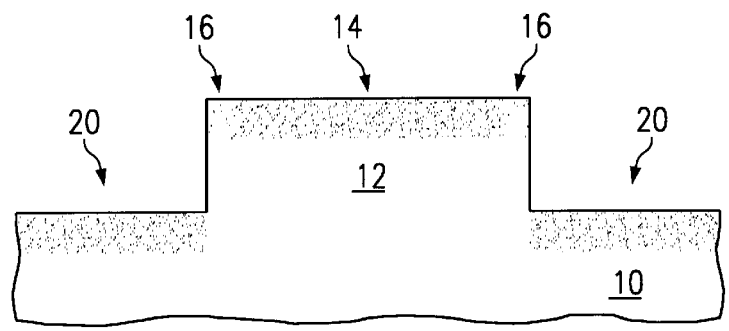

A common method used for manufacturing mesas and doping them in semiconductor devices will be discussed first and is illustrated in FIGS. 1 and 2. FIG. 1 shows a semiconductor wafer that has a substrate 10 which may, for contain transistors, diodes and semiconductor elements, (not shown) as are well known in the art. The substrate 10 has been patterned and etched to create 12 and recesses or trenches 20 in the semiconductor substrate 10. mesas 12 comprise active areas of the semiconductor substrate 10. where transistors and other devices are subsequently formed. The semiconductor wafer is then subjected to ion implantation. As they approach the wafer, the implanted ions are initially highly columnated, traveling from a distant source in a high vacuum, with little chance of collision with gas atoms that may be present in the implantation chamber. When the ions enter a solid material such as the mesa 12 or semiconductor substrate 10, however, they undergo scattering with essentially stationary atoms in the solid. This causes the ions to be scattered from their original parallel path, shown by the arrows in FIG. 1. (The arrows in FIG. 1 indicate the ion paths.) This lateral ion straggling is random and because there are a very large number of ions in the implanted beam, the average doping is quite uniform in the center region 14 of the mesa 12. The dopant concentration level is very uniform in the center region 14 because the loss of ions scattered away from a particular volume of material is compensated for by the gain of ions scattered into the same volume from the adjacent portions of the ion beam.

At or near the edge of a step in the topography of the wafer, however, such as the edge region 16 of the mesa 12, there is no mechanism for ions to be scattered into the volume of material from the open side. These ions exit the edge as shown by the arrows in FIG. 1 in the edge region 16, and then continue in their paths until they strike the substrate 10 or buried layer below. Therefore, there is a net loss of dopant near the edge regions 16, with the loss becoming more severe closer to the edge. This results in a lower doping density of ion-implanted dopant in the edge regions 16 of the mesas 12 due to lateral straggling as shown in FIG. 2, which is a problem in the art. The surfaces of the trenches 20 are also doped during the ion implantation step, as shown in FIG. 2, which may not be desired.

Figure 3:
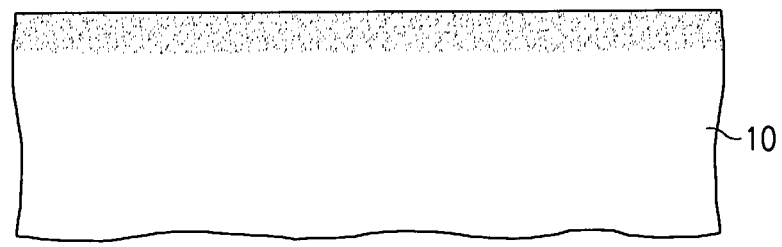
FIGS. 3 and 4 illustrate in cross section a preferred embodiment of the present invention.
Figure 4:
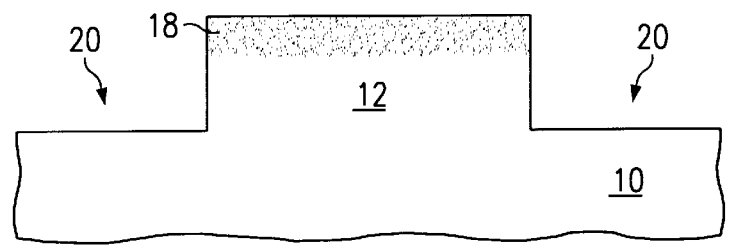

The present invention solves the problem of lower density of ion-implanted dopant in the edge regions 16 of mesas 12 on semiconductor wafers, and also the problem of undesired doping of the trench 20 surface. A preferred embodiment of the present invention is depicted in FIGS. 3 and 4. In this embodiment, the doping step is performed before the formation of the mesas 12. FIG. 3 shows a substrate 10 that has been exposed to ion implantation (for example, with boron, phosphorous, arsenic, antimony or indium) and has a uniform doping density across the surface of the semiconductor substrate 10. The dopant concentration is preferably approximately 1E17 to 4E18 ions/cm$^3$. Next, the wafer is patterned and etched to form mesas 12, as shown in FIG. 4. The mesas 12 preferably have a depth of 0.4 $\mu$m, and are more preferably approximately 0.1 $\mu$m deep. The surfaces of the mesas 12 contain uniformly-doped regions 18 where the dopant is uniform along a plane parallel to the wafer surface. The structure is absent the problem in the prior art of non-uniformly-doped mesa surfaces and absent the problem of undesired trench surface doping.

An advantage of the present invention is that uniformly-doped regions 18 are formed on the surface of the mesas 12 of the semiconductor wafer. These uniformly-doped regions 18 are absent the problem of non-uniform dopant concentrations found in prior art mesas. Another advantage of the present invention is a semiconductor structure having evenly-doped mesas 12 yet also having undoped trenches 20 (see FIG. 4).

While the invention has been described with reference to illustrative embodiments, this description is not intended to be construed in a limiting sense. Various modifications and combinations of the illustrative embodiments, as well as other embodiments of the invention, will be apparent to a person skilled in the art upon reference to the description. It is therefore intended that the appended claims encompass any such modifications or embodiments.

What is claimed is:

1. A method for manufacturing a mesas at semiconductor surface, comprising the steps of:

implanting dopant ions into a surface of a semiconductor wafer; and then removing selected portions of said surface to leave a mesa at said surface, said mesa having a uniformly-doped region at an upper surface.

2. The method of claim 1 wherein said implanting step comprises implanting said surface with ions of a material selected from the group consisting of boron, phosphorous, arsenic, antimony, and indium.

3. The method of claim 1 wherein said removing step comprises etching trenches into said surface of said semiconductor wafer.

4. The method of claim 3 wherein said etching step etches the surface to a depth beyond a range of the implanting step, so that substantially none of the implanted dopant ions are present at upper surfaces of said trenches.

* * * * *